US008456156B2

(12) United States Patent
Gao et al.

(10) Patent No.: US 8,456,156 B2
(45) **Date of Patent: *Jun. 4, 2013**

(54) PROBE

(75) Inventors: Xu Gao, Beijing (CN); Zhi-Jun Zhang, Beijing (CN); Zheng-He Feng, Beijing (CN); Steven-Philip Marcher, Beijing (CN); Zhan Li, Beijing (CN); Yong Yan, Beijing (CN)

(73) Assignees: Tsinghua University, Beijing (CN); Hon Hai Precision Industry Co., Ltd., New Taipei (TW)

( * ) Notice: Subject to any disclaimer, the term of this patent is extended or adjusted under 35 U.S.C. 154(b) by 457 days.

This patent is subject to a terminal disclaimer.

(21) Appl. No.: 12/770,990

(22) Filed: Apr. 30, 2010

(65) Prior Publication Data

US 2011/0101962 A1 May 5, 2011

(30) Foreign Application Priority Data

Oct. 30, 2009 (CN) .......................... 2009 1 0110163

(51) Int. Cl.
*G01R 1/06* (2006.01)

(52) U.S. Cl.
USPC ........................................... 324/149; 324/144

(58) Field of Classification Search
USPC .......................................................... 324/149
See application file for complete search history.

(56) References Cited

U.S. PATENT DOCUMENTS 5,039,824 A * 8/1991 Takashima et al. ............. 174/33
5,113,159 A 5/1992 Adriaenssens et al.
2009/0085706 A1 4/2009 Baarman et al.
2009/0237183 A1 9/2009 Chen et al.

FOREIGN PATENT DOCUMENTS

| | | |
|---|---|---|
| EP | 0400885 | 12/1990 |
| GB | 380101 | 9/1932 |
| TW | 207834 | 6/1993 |
| TW | M294675 | 7/2006 |
| TW | 200938017 | 9/2009 |
| TW | 200941937 | 10/2009 |

OTHER PUBLICATIONS

Hearing Aid Compatibility, ANSI C63.19 Standard, CC Communications, p. 1-4.*
Lair "Method of disturbance prevention in high frequency electrical transmission systems and means thereof", Sep. 1, 1932, GB38101, p. 1-23.*

* cited by examiner

*Primary Examiner* — Thomas Valone
(74) *Attorney, Agent, or Firm* — Altis Law Group, Inc.

(57) ABSTRACT

A probe includes a circuit board, an electric field detecting probe, and a magnetic field detecting probe. The electric field detecting probe and the magnetic field detecting probe are located on the circuit board. An anti-jamming distance between the two detecting probes is a multiple of 5 millimeters and is greater than or equal to 10 millimeters.

20 Claims, 10 Drawing Sheets

PROBE

CROSS-REFERENCE

This application claims all benefits accruing under 35 U.S.C. §119 from China Patent Application No. 200910110163.4, filed on Oct. 30, 2009 in the China Intellectual Property Office, the disclosure of which is incorporated herein by reference. This application is related to copending applications entitled, "METHOD FOR MEASURING HEARING AID COMPATIBILITY", filed Apr. 30, 2010 Ser. No. 12/770,977 and "HIGH-IMPEDANCE LINE AND DETECTING SYSTEM HAVING THE SAME", filed May 19, 2010 Ser. No. 12/782,822.

BACKGROUND

1. Technical Field

The present disclosure relates to probes, especially to a probe for detecting hearing aid compatibility (HAC).

2. Description of Related Art

The Federal Communications Commission (FCC) has established significant new regulations requiring that mobile handsets be hearing aid compatible. The regulations use ANSI C63.19 as the measurement method and criteria for determining hearing aid compatibility (HAC). To evaluate radio frequency compliance of a wireless communications device earpiece (WD earpiece), near-field measurements can be made in the vicinity of the WD earpiece, using an electric field probe and a magnetic field probe. In the measurement method, the electric field probe and the magnetic field probe scan a 50 by 50 millimeter region close to the WD earpiece separately. After a parameter of the electric field is detected by the electric field probe, the electric field probe should be replaced by the magnetic field probe to detect a parameter of the magnetic field. However, the magnetic field probe needs to be adjusted. Thus, the replacement and calibration steps increase measurement time and inefficient.

What is needed, therefore, is to provide a probe for detecting the HAC with high efficiency.

BRIEF DESCRIPTION OF THE DRAWINGS

Many aspects of the embodiments can be better understood with references to the following drawings. The components in the drawings are not necessarily drawn to scale, the emphasis instead being placed upon clearly illustrating the principles of the embodiments. Moreover, in the drawings, like reference numerals designate corresponding parts throughout the several views.

DETAILED DESCRIPTION

The disclosure is illustrated by way of example and not by way of limitation in the figures of the accompanying drawings in which like references indicate similar elements. It should be noted that references to "an" or "one" embodiment in this disclosure are not necessarily to the same embodiment, and such references mean at least one.

Figure 1:
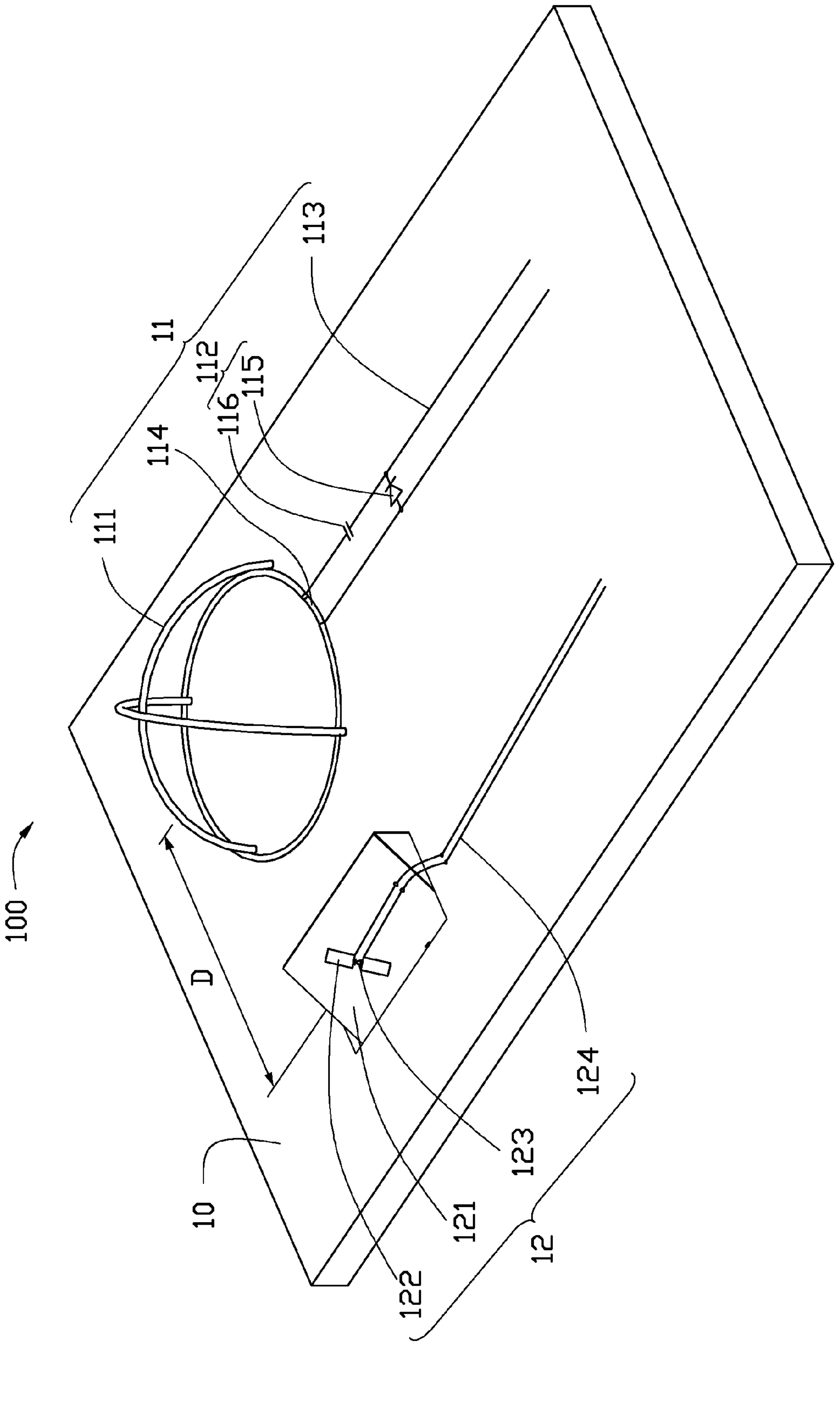
FIG. 1 is a schematic structural view of an embodiment of a probe.
Figure 2:
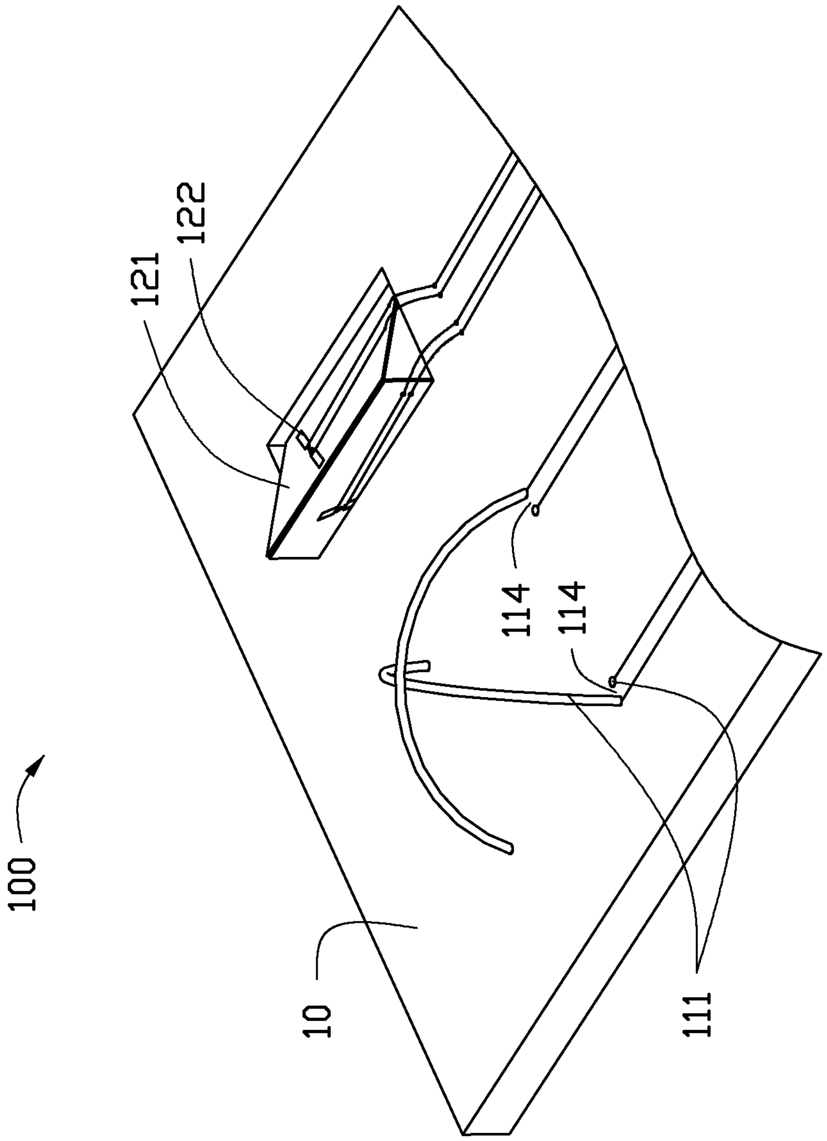
FIG. 2 is a schematic partial structural view of the probe of FIG. 1, shown from another aspect.

Referring to FIG. 1 and FIG. 2 of an embodiment, a probe 100 includes a circuit board 10, a magnetic field detecting probe 11 and an electric field detecting probe 12. The magnetic field detecting probe 11 and the electric filed detecting probe 12 are located on the circuit board 10, an anti-jamming distance D between the two detecting probes 11 and 12 being a multiple of 5 millimeters and being greater than or equal to 10 millimeters. It should be noted that the anti-jamming distance D between the two detecting probes 11 and 12 is designed according to regulations using ANSI C63.19 as the measurement method and criteria for hearing aid compatibility (HAC). The anti jamming distance D between the two detecting probes 11 and 12 can be changed according to changes of the regulation or different regulations.

Figure 3:
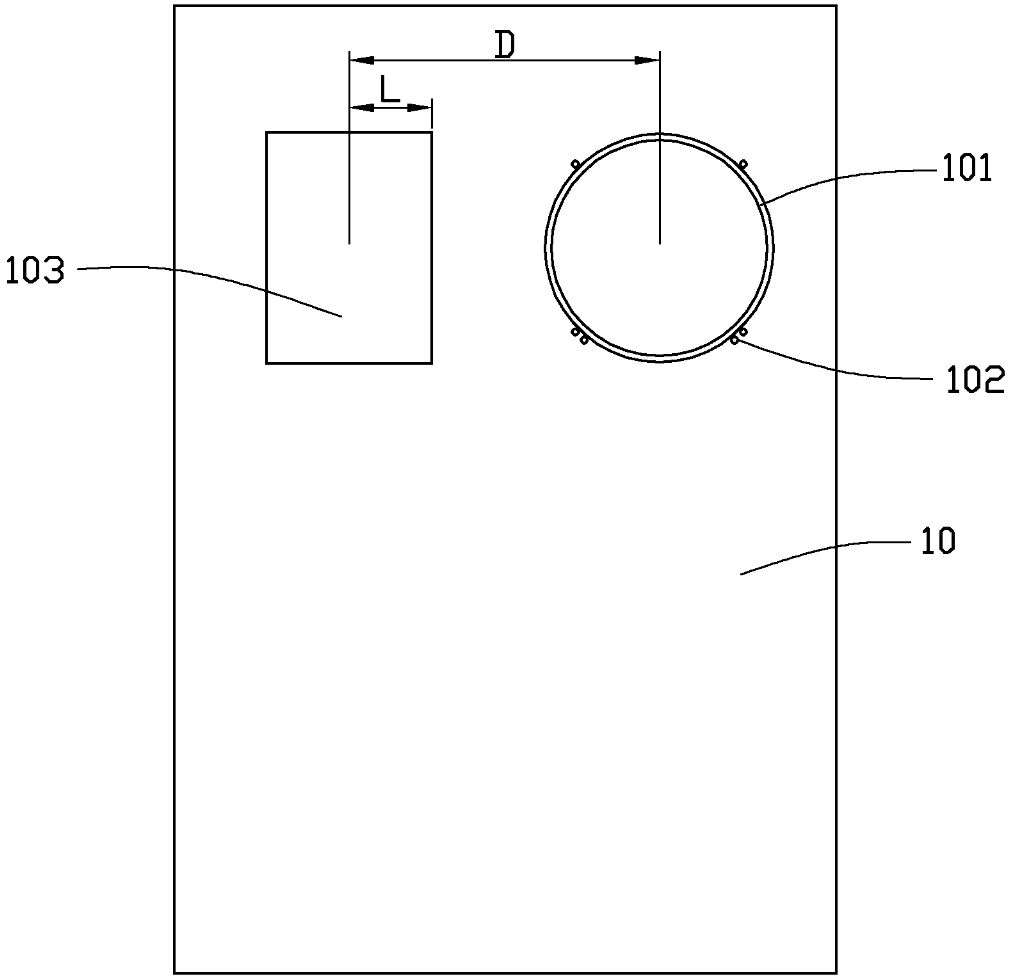
FIG. 3 is a schematic structural view of an embodiment of a circuit board of the probe.

Referring to FIG. 3, the magnetic field detecting probe 11 and the electric field detecting probe 12 are disposed on the circuit board 10. The circuit board 10 can be a panel or a printed circuit board (PCB). The circuit board 10 has a top surface and a bottom surface to support electrical elements such as the detecting probes 11 and 12 thereon. The circuit board 10 can include a circular groove 101, six fixing holes 102, and an opening 103 at the top surface. The six fixing holes 102 and the opening 103 are defined through the circuit board 10. The magnetic field detecting probe 11 can be fixed on the circuit board 10 by the groove 101 and the fixing holes 102. The electric field detecting probe 12 can be fixed on the circuit board 10 by the opening 103. A diameter D1 of the groove 101 can be less than or equal to 10 millimeters. In one embodiment, the diameter D1 of the groove 101 is about 6 millimeters. The shape of the opening 103 can be rectangle, elliptical, or triangular shaped. A distance L between the geometric center of the opening 103 and a fringe/edge of the opening 103 can be less than about 5 millimeters. In one embodiment, the opening 103 is a rectangle shaped opening, and the distance L between the geometric center of the opening 103 and the fringe/edge of the opening 103 is about 3 millimeters. A distance between the geometric centers of the groove 101 and the opening 103 can be substantially equal to the anti jamming distance D.

Figure 4:
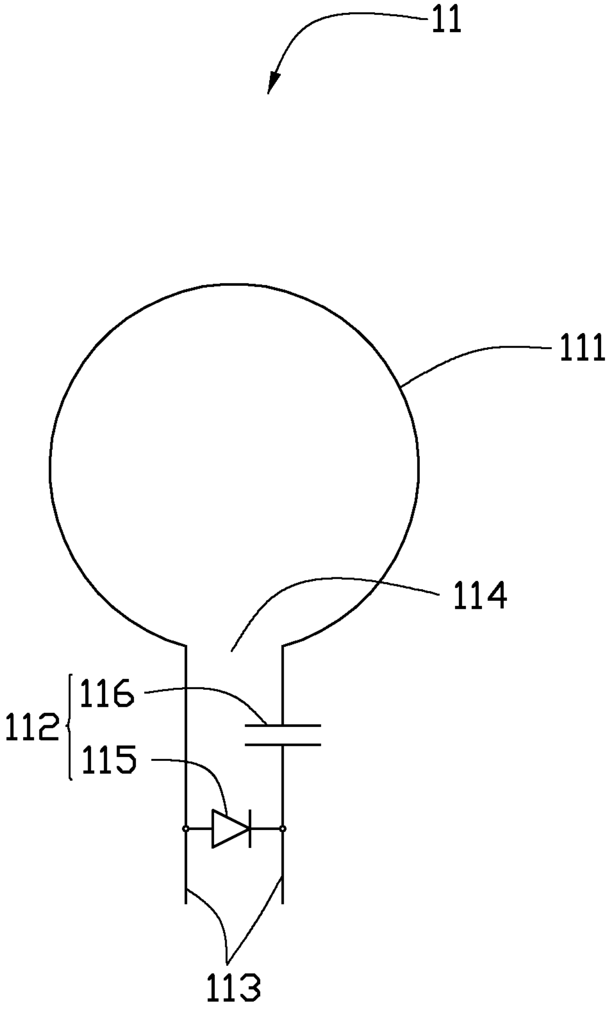
FIG. 4 is a schematic structural view of an embodiment of a magnetic field detecting probe of the probe.

Referring to FIGS. 1-2 and 4, the magnetic field detecting probe 11 can include three mutually orthogonal loops 111, three first demodulation circuits 112, and three pairs of first high-impedance transmission lines 113. The first demodulation circuits 112 can be electrically connected to the first loops 111 and the first high-impedance transmission lines 113. The first demodulation circuits 112 and the first high-impedance transmission lines 113 can be disposed on either the top surface or the bottom surface of the circuit board 10. In one embodiment, one first demodulation circuit 112 and one first high-impedance transmission line 113 are disposed on the top surface as shown in FIG. 1, and the other two first demodulation circuits 112 and two first high-impedance transmission lines 113 are disposed on the bottom surface.

The three loops 111 can be mutually orthogonal and rotate about its geometric center to detect signals in the three orthogonal axes. The loops 111 can have substantially equal diameters. The geometric centers of the loops 111 substantially lie on a common axis. The shape of the loops 111 can be circular, square, elliptical, triangular or other shapes. In one embodiment, the loops 111 are circular loops each having a diameter of about 6 millimeters. The circular loops 111 with a determined length can surround the largest acreage and can obtain the largest flux. A material of the loops 111 can be a metallic material such as gold, silver, nickel, copper, or other metallic material. The loops 111 can be connected in parallel. The three loops 111 can be kept insulated from each other by separating intersecting portions of two loops 111 or filling an insulation material between the intersecting portions of two loops 111. The insulation material can be for example, rubber or paint. Each of the loops 111 can have a cut 114 thereby forming two opposite outputting ends thereon. One of the loops 111 can be substantially parallel to the top surface of the circuit board 10 and be disposed on the circuit board 10. The other two loops 111 can be substantially perpendicular to the circuit board 10, and the cuts 114 of the two loops 111 can be close to the circuit board 10. In one embodiment, the loop 111 is substantially parallel to the circuit board 10 and engaged in the groove 101; and other two loops 111 are substantially perpendicular to the circuit board 10 and fixed on the circuit board 10 by extending through the fixing holes 102.

Each of the first demodulation circuits 112 can be electrically connected to the two outputting ends of one loop 111. Each of the first demodulation circuits 112 can include a first demodulation diode 115 and a capacitor 116. The first demodulation diode 115 and the capacitor 116 can be connected in series as show in FIG. 4. The first demodulation diode 115 is capable of filtering transmitted radio frequency signals (RF signals) thereby passing low frequency signals and shielding high frequency signals. The first demodulation circuits 112 can be configured for extracting signal envelopes from the RF signals detected by the loops 111. The RF signals can be amplitude modulation signals, frequency modulation signals, or combination thereof. In one embodiment, the RF signals are modulation signals radiated from an antenna of a wireless communications device such as GSM mobile or CDMA mobile. The amplitude modulation signals can be high frequency signals loading low frequency signals. If the amplitude modulation signals are transmitted by the first demodulation diode 115, a negative part of the low frequency signals can be cut to obtain a positive part of the low frequency signals. The positive part of the low frequency signals can be the signal envelopes of the magnetic field strengths of the signal source.

Figure 5:
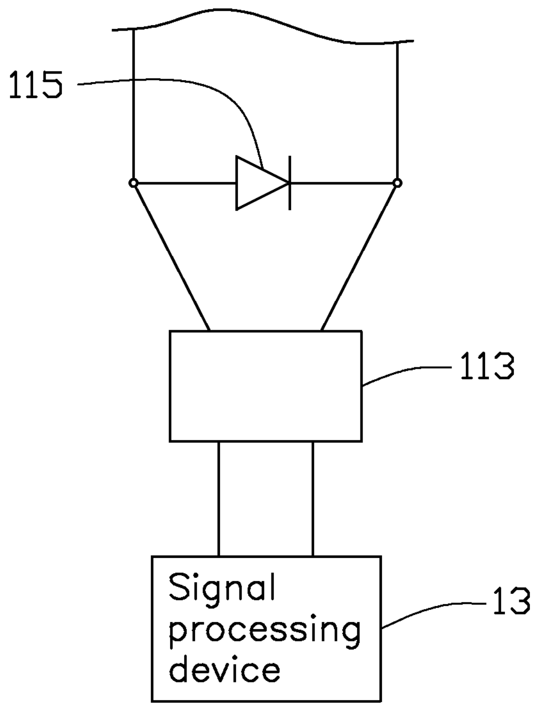
FIG. 5 is a schematic structural view of an embodiment of the magnetic field detecting probe and a signal processing device electrically connected to the magnetic field detecting probe of the probe.
Figure 6:
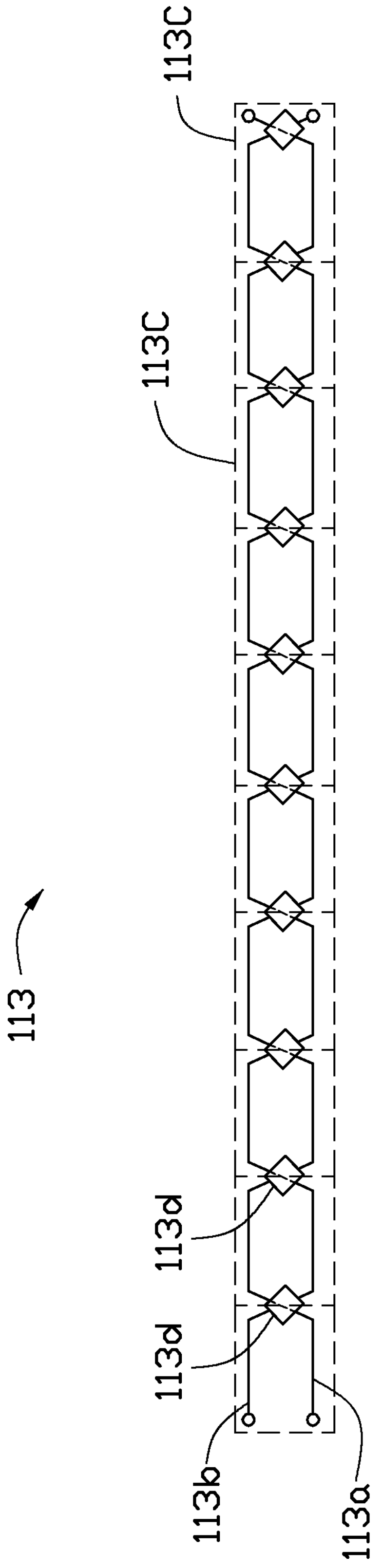
FIG. 6 is a schematic structural view of a first high-impedance line an embodiment of the probe in FIG. 5.
Figure 7:
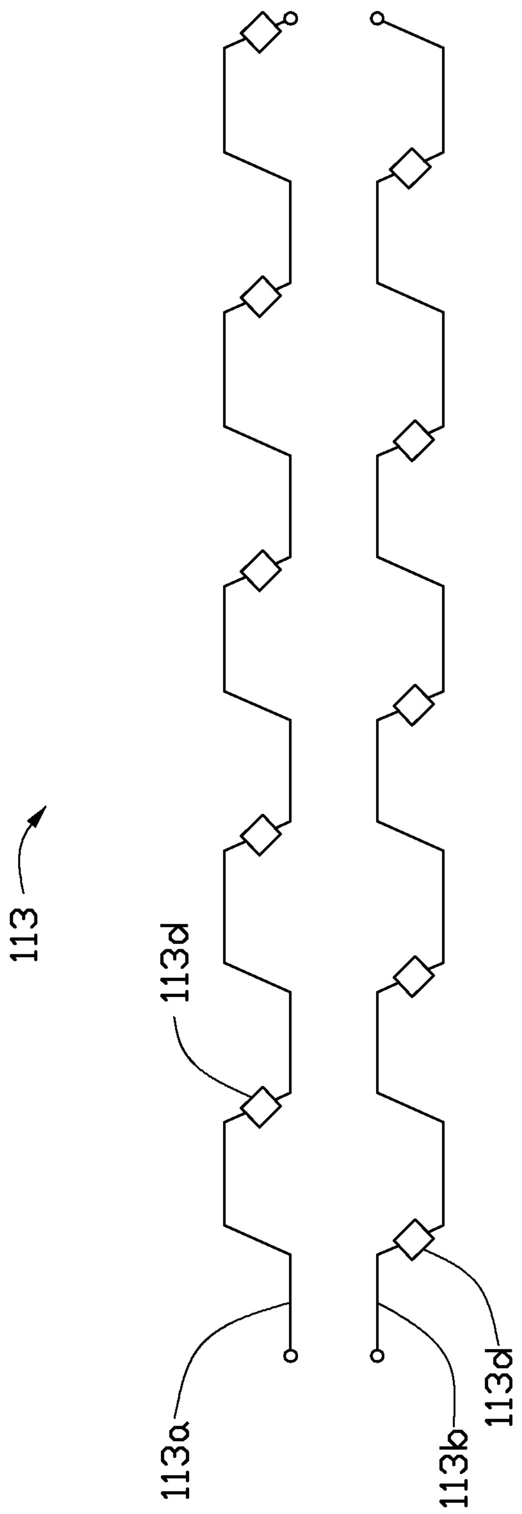
FIG. 7 is an exposed view of the high-impedance line shown in FIG. 6.

Referring to FIG. 5, the first high-impedance lines 113 can be configured for transmitting signal envelopes obtained by each of the first demodulation circuits 112 to a signal processing device 13. The signal processing device 13 can be an analog-digital converter (ADC), a central processing unit (CPU), or other data-processing equipment. The first high-impedance lines 113 can be capable of shielding high frequency signals of the signal envelopes. Referring to FIG. 6 and FIG. 7, in one embodiment, each of the first high-impedance lines 113 includes a first transmission line 113*a*, a second transmission line 113*b* intersected with the first transmission line 113*a* to form more than two windings 113*c*, and a resistance unit 113*d* electrically connected between two adjacent windings 113*c*. Each winding 113*c* is surrounded by a rectangular dotted line in FIG. 6.

The detailed structure of the magnetic field detecting probe 11 has been described above. The magnetic field detecting probe 11 can also be divided into three units. Each unit is defined by one orthogonal loop 111, one first demodulation circuit 112, and one pair of the first high-impedance transmission lines 113. In each unit, one end of the first demodulation diode 115 connected to one outputting end of the orthogonal loop 111. The opposite end of the first demodulation diode 115 connects to the other outputting end of the orthogonal loop 111. The capacitor 116 connects between the opposite end of the first demodulation diode 115 and the other outputting end of the orthogonal loop 111. One first high-impedance transmission line 113 connects one end of the first demodulation diode 115. The other first high-impedance transmission line 113 connects to the opposite end of the first demodulation diode 115.

Figure 8:
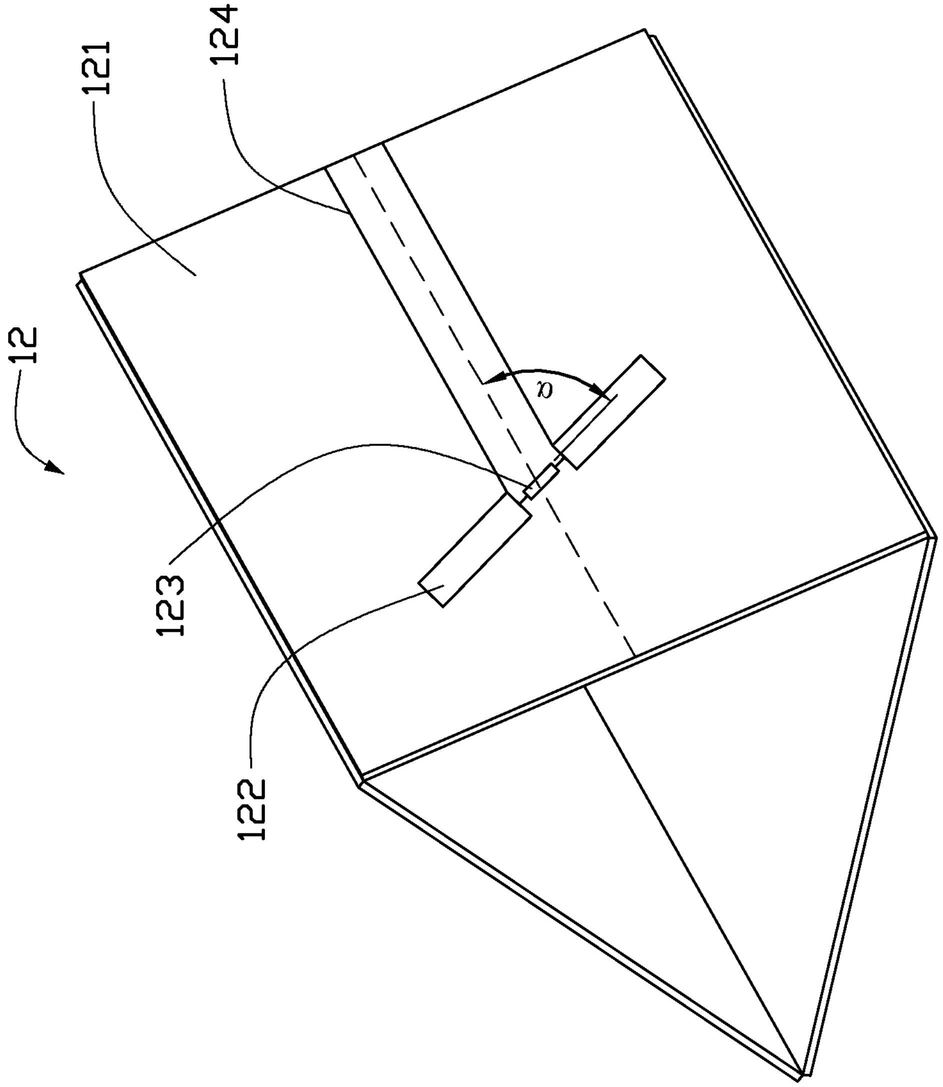
FIG. 8 is a schematic structural view of an embodiment of an electric field detecting probe of the probe.

Referring to FIG. 2 and FIG. 8, the electric field detecting probe 12 can include a supporting element 121, three mutually orthogonal dipoles 122 disposed on the supporting element 121, three second demodulation circuits 123, and three second high-impedance transmission lines 124. The second demodulation circuits 123 can be electrically connected to the dipoles 122 and the second high-impedance transmission lines 124. The second demodulation circuits 123 and the second high-impedance transmission lines 124 can be disposed on either the top surface or the bottom surface of the circuit board 10. In on embodiment, one second demodulation circuit 123 and one second high-impedance transmission line 124 are disposed on the top surface as shown in FIG. 1; and the other two second demodulation circuits 123 and two second high-impedance transmission lines 124 are disposed on the bottom surface as shown in FIG. 2.

The supporting element 121 can be fixed on the circuit board 10 by extending through the opening 103. The supporting element 121 can be a hollow rhombus-liked structure formed by three panels connecting end to end. A cross-section of the supporting element 121 can be an equilateral triangle. One panel of the supporting element 121 can be substantially perpendicular to the circuit board 10, thus the symmetry axis of the supporting element 121 can be substantially parallel to the circuit board 10.

Figure 9:
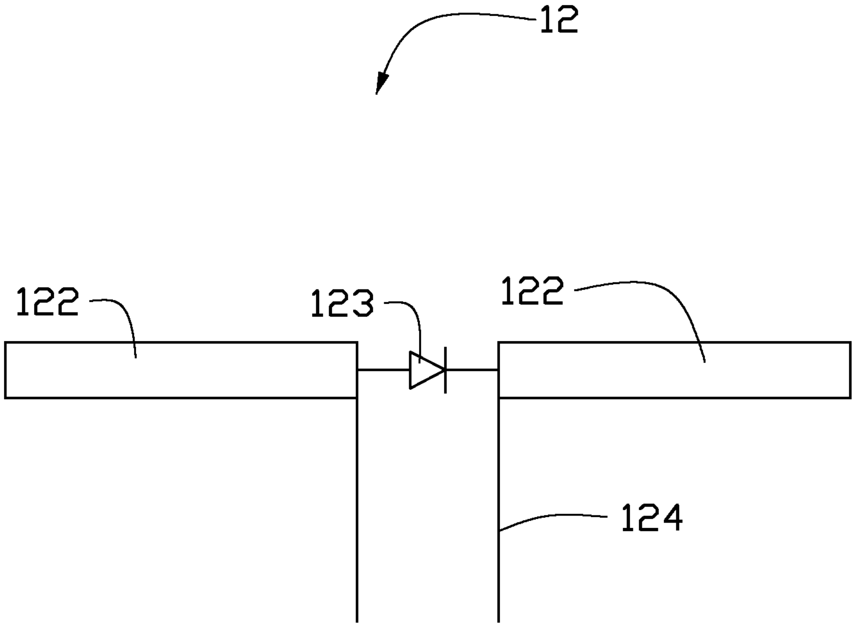
FIG. 9 is a circuit diagram of an embodiment of the electric field detecting probe.

Referring to FIG. 9, the dipoles 122 can be configured for measuring electric field strengths. Each of the dipoles 122 can be a pair of equal and opposite poles separated by a small distance. A length of each of the dipoles 122 can be less than 7 millimeters. A length of each of the poles can be less than about 3 millimeters. In one embodiment, the length of the dipole 122 is about 6 millimeters; and the length of the pole is about 2.5 millimeters. The three dipoles 122 can form a symmetrical structure. The geometric center of the symmetrical structure can substantially lie on the center axis of the supporting element 121. An angle $\alpha$ between the center axis of the supporting element 121 and the center axis of the dipoles 122 can be about 54.7 degrees. A material of the dipoles 122 can be a metallic material such as gold, silver, nickel, copper, and so on.

The anti jamming distance D is usually a distance between the geometric center of the symmetric structure formed by the three dipoles 122 and the geometric center of the loops 111. When the probe 100 is in operation, the anti jamming distance D between the electric field detecting probe 11 and the magnetic field detecting probe 12 can ensure the probe 100 works properly. In other words, the electric field detecting probe 11 and the magnetic field detecting probe 12 can work together if the anti-jamming distance D is greater than about 10 millimeters. In one embodiment, the anti jamming distance D is about 10 millimeters.

The function of the second demodulation circuits 123 can be similar to the first demodulation circuits 112. Each of the second demodulation circuits 123 can include a second demodulation diode electrically connected between the two poles of the dipoles 122.

Figure 10:
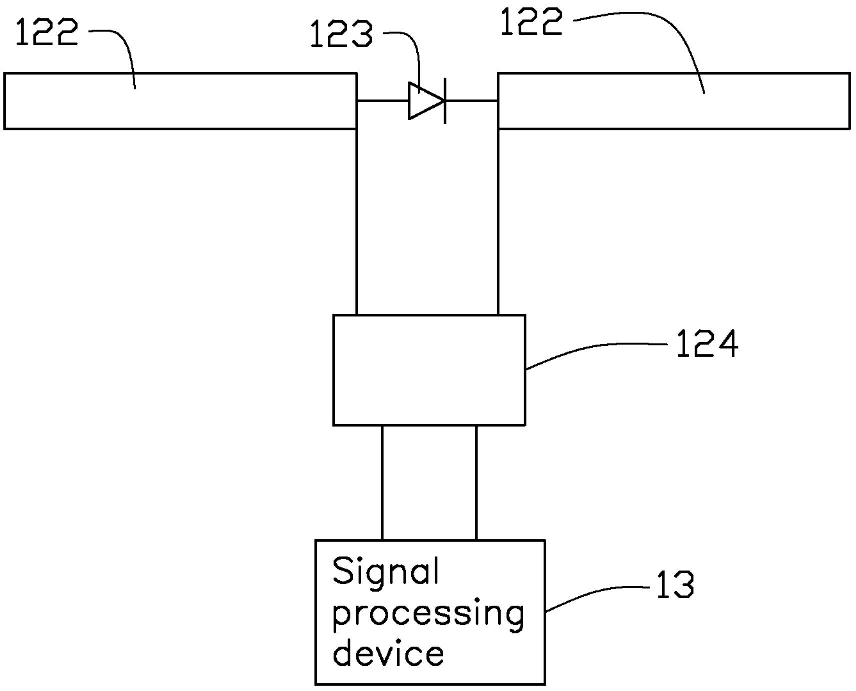
FIG. 10 is a schematic structural view of an embodiment of the electric field detecting probe and a signal processing device electrically connected to the electric field detecting probe of the probe.

The function and the structure of the second high-impedance lines 124 can be similar to the first high-impedance lines 113. Referring to FIG. 10, each of the second high-impedance lines 124 can include two transmission lines electrically connected to two opposite ends of the second demodulation diode, and transmit signal envelopes obtained by each of the second demodulation circuits 123 to the signal processing device 13.

When the probe 100 is in operation, the probe 100 can obtain the electric field strengths and the magnetic field strengths in the same time in most of testing points, and decrease time for measuring HAC. Furthermore, the magnetic field detecting probe 11 and the electric field detecting probe 12 can be mounted together on the circuit board 10. Thus, time for replacing the electric field detecting probe 12 or the magnetic field detecting probe 11 can be omitted.

Finally, it is to be understood that the above-described embodiments are intended to illustrate rather than limit the disclosure. Variations may be made to the embodiments without departing from the spirit of the disclosure as claimed. Elements associated with any of the above embodiments are envisioned to be associated with any other embodiments. The above-described embodiments illustrate the scope of the disclosure but do not restrict the scope of the disclosure.

What is claimed is:

1. A probe, comprising:

a circuit board;

an electric field detecting probe; and a magnetic field detecting probe;

wherein the electric field detecting probe and the magnetic field detecting probe are located on the circuit board, and an anti jamming distance between the two detecting probes is a multiple of 5 millimeters and is greater than or equal to 10 millimeters.

2. The probe as claimed in claim 1, wherein the circuit board comprises a circular groove for fixing the magnetic field detecting probe, and an opening for fixing the electric field detecting probe, the opening is defined through the circuit board, a distance between geometric centers of the groove and the opening is substantially equal to the anti jamming distance.

3. The probe as claimed in claim 2, wherein a distance between a geometric center of the opening and a fringe of the opening is less than about 5 millimeters.

4. The probe as claimed in claim 1, wherein the magnetic field detecting probe comprises three mutually orthogonal loops, the loops being insulated from each other.

5. The probe as claimed in claim 4, wherein each of the loops has a cut to form two opposite ends thereon.

6. The probe as claimed in claim 5, wherein one of the loops is parallel to a surface of the circuit board and is disposed on the circuit board, the other two loops are perpendicular to the circuit board, the cuts of the two loops are close to the circuit board.

7. The probe as claimed in claim 5, further comprising a first demodulation circuit, the first demodulation circuit being electrically connected between the ends of the each of the loops.

8. The probe as claimed in claim 7, wherein the first demodulation circuit comprises a demodulation diode and a capacitance, the demodulation diode and the capacitor are connected in series.

9. The probe as claimed in claim 1, wherein the electric field detecting probe comprises three mutually orthogonal dipoles, the mutually orthogonal dipoles being insulated from each other.

10. The probe as claimed in claim 9, wherein the electric field detecting probe further comprises a supporting element having three sidewalls, the dipoles being disposed on the sidewalls.

11. The probe as claimed in claim 10, wherein a cross-section of the supporting element is an equilateral triangle, and an angle between the axis line of the supporting element and the axis of one dipole is about 54.7 degrees.

12. The probe as claimed in claim 10, wherein the supporting element is a hollow rhombus-like structure formed by three panels connecting end to end.

13. The probe as claimed in claim 10, wherein each of the dipoles comprises a pair equal and opposite poles located apart from each other.

14. The probe as claimed in claim 13, wherein a length of each of the dipoles is less than or equal to 7 millimeters; and a length of each of the poles is less than or equal to 3 millimeters.

15. The probe as claimed in claim 14, wherein the length of each of the dipoles is about 6 millimeters; and a length of each of the poles is about 2.5 millimeters.

16. The probe as claimed in claim 13, further comprising a second demodulation circuit, the second demodulation circuit being electrically connected between the poles of the each of the loops.

17. The probe as claimed in claim 16, wherein the second demodulation circuit comprises a demodulation diode.

18. A probe, comprising:

a circuit board;

an electric field detecting probe; and a magnetic field detecting probe;

wherein the electric field detecting probe and the magnetic field detecting probe are located on the circuit board, and an anti jamming distance between the two detecting probes is greater than or equal to 10 millimeters.

19. A probe, comprising:

a circuit board;

a signal processing device;

a magnetic field detecting probe;

a first high-impedance line electrically connected between the signal processing device and the magnetic field detecting probe;

an electric field detecting probe; and a second high-impedance line electrically connected between the signal processing device and the electric field detecting probe;

wherein the electric field detecting probe and the magnetic field detecting probe are located on the circuit board, and an anti jamming distance between the two detecting probes is a multiple of 5 millimeters and is greater than or equal to 10 millimeters.

20. The probe as claimed in claim 19, wherein the first or the second high-impedance line comprises two transmission lines intersecting with each other to form more than two windings, and a resistance unit electrically connected between two adjacent windings.

* * * * *